(12) United States Patent
Waldfried

(10) Patent No.: US 11,764,037 B2
(45) Date of Patent: Sep. 19, 2023

(54) SURFACE COATING FOR CHAMBER COMPONENTS USED IN PLASMA SYSTEMS

(71) Applicant: ENTEGRIS, INC., Billerica, MA (US)

(72) Inventor: Carlo Waldfried, Middleton, MA (US)

(73) Assignee: ENTEGRIS, INC., Billerica, MA (US)

( * ) Notice: Subject to any disclaimer, the term of this patent is extended or adjusted under 35 U.S.C. 154(b) by 225 days.

(21) Appl. No.: 15/038,724

(22) PCT Filed: Nov. 21, 2014

(86) PCT No.: PCT/US2014/066883
§ 371 (c)(1),
(2) Date: May 23, 2016

(87) PCT Pub. No.: WO2015/077601
PCT Pub. Date: May 28, 2015

(65) Prior Publication Data
US 2017/0032942 A1 Feb. 2, 2017

Related U.S. Application Data

(60) Provisional application No. 61/907,214, filed on Nov. 21, 2013.

(51) Int. Cl.
*H01J 37/32* (2006.01)
*C23C 14/06* (2006.01)
(Continued)

(52) U.S. Cl.
CPC .... *H01J 37/32495* (2013.01); *C23C 14/0676* (2013.01); *C23C 14/083* (2013.01); *C23C 14/35* (2013.01)

(58) Field of Classification Search
CPC ............ C23C 14/0021; C23C 14/0676; C23C 14/083; C23C 14/3485; C23C 14/35; C23C 16/4404; H01J 37/32495
See application file for complete search history.

(56) References Cited

U.S. PATENT DOCUMENTS 4,931,756 A 6/1990 Doehler
4,950,558 A * 8/1990 Sarin ...................... C04B 41/52
428/212
(Continued)

FOREIGN PATENT DOCUMENTS

CN 1663017 A 8/2005
CN 102676989 A * 9/2012 ......... C23C 14/0036
(Continued)

OTHER PUBLICATIONS

Merriam Webster .com; definition of quartz; https://www.merriam-webster.com/dictionary/quartz Jan. 17, 2020 (Year: 2020).*
(Continued)

*Primary Examiner* — Humera N. Sheikh
*Assistant Examiner* — Elizabeth D Ivey

(57) ABSTRACT

Disclosed herein are surface coatings for plasma components that have the benefit of being robust against chemical and plasma physical attack in aggressive (e.g., fluorine-based) plasma environments. The coatings also provide low plasma surface recombination rates for active oxygen, nitrogen, fluorine, and hydrogen species when compared with other known surface treatments. The coatings can be applied to any plasma system component not requiring etching or plasma cleaning including but not limited to materials like quartz, aluminum, or anodized aluminum. Additionally, the efficiency of the system is increased by applying a non-reactive coating to system components thereby increasing the flow of excited plasma species to the plasma chamber of the system.

20 Claims, 2 Drawing Sheets

(51) Int. Cl.
*C23C 14/35* (2006.01)
*C23C 14/08* (2006.01)

(56) References Cited

U.S. PATENT DOCUMENTS

| | | | |
|---|---|---|---|
| 5,616,208 A * | 4/1997 | Lee | H01L 21/67766 |
| | | | 156/345.24 |
| 9,761,417 B2 * | 9/2017 | Gunda | H01J 37/32495 |
| 2004/0002221 A1 * | 1/2004 | O'Donnell | C23C 16/4404 |
| | | | 438/710 |
| 2004/0168631 A1 | 9/2004 | Honjou | |
| 2005/0024809 A1 * | 2/2005 | Kuchimachi | H01L 21/6833 |
| | | | 361/234 |
| 2005/0241669 A1 * | 11/2005 | Wodecki | H01J 37/32082 |
| | | | 134/1.1 |
| 2007/0028842 A1 * | 2/2007 | Inagawa | H01J 37/32458 |
| | | | 118/728 |
| 2007/0138601 A1 * | 6/2007 | Fan | H01L 21/67011 |
| | | | 257/632 |
| 2013/0023029 A1 | 1/2013 | Van Der Laan | |
| 2013/0216783 A1 * | 8/2013 | Duan | C04B 35/111 |
| | | | 428/143 |
| 2013/0284373 A1 * | 10/2013 | Sun | B05D 3/002 |
| | | | 174/255 |
| 2014/0178679 A1 | 6/2014 | Gunda | |
| 2014/0208662 A1 * | 7/2014 | Wendt | B24D 3/06 |
| | | | 51/309 |
| 2014/0295670 A1 * | 10/2014 | Shih | C23C 28/322 |
| | | | 438/710 |
| 2021/0180191 A1 * | 6/2021 | Fouliard | C23C 28/3455 |

FOREIGN PATENT DOCUMENTS

| | | | | |
|---|---|---|---|---|
| CN | 102676989 | A | | 9/2012 |
| JP | H01108187 | A | | 4/1989 |
| JP | H02-22460 | A | | 1/1990 |
| JP | 2004-214624 | A | | 7/2004 |
| JP | 2006-089338 | A | | 4/2006 |
| JP | 2007290933 | A | * | 11/2007 |
| JP | 2007290933 | A | | 11/2007 |
| JP | 2009-280483 | A1 | | 12/2009 |
| JP | 2010535288 | A | | 11/2010 |
| JP | 2011509343 | A | | 3/2011 |
| JP | 2013063644 | A | | 4/2013 |
| JP | 2014-522916 | A | | 9/2014 |
| WO | 2013/023029 | A2 | | 2/2013 |
| WO | WO-2013023029 | A2 | * | 2/2013 ........ H01J 37/32495 |

OTHER PUBLICATIONS

Bib Data and Translation; JP-2007290933-A; Nakahara, Masahiro; Nov. 2007 (Year: 2007).*
Bib Data and Translation—CN-102676989-A; NanMa etal; Sep. 2012 (Year: 2012).*
McCauley, Structure and Properties of Aluminum Nitride and AION Ceramics, army research laboratory, 2002.
Xiao et al., Materials development and potential applications of transparent ceramics: A review, Materials Science and Engineering: R: Reports, vol. 139, pp. 1-65, 2020.
Jianqiang Bi et al., Special ceramics Process and Properties, Harbin Institute of Technology Press, Mar. 2008, p. 224. (See p. 2 line 1-6 of NPL 2 for English translation for relevance of NPL 1).
Translation of Chinese Office Action dated Oct. 27, 2021, for Chinese application No. 201480073572.0.

* cited by examiner

SURFACE COATING FOR CHAMBER COMPONENTS USED IN PLASMA SYSTEMS

RELATED APPLICATIONS

This application claims the benefit of U.S. Provisional Patent Application No. 61/907,214 filed Nov. 21, 2013, the disclosure of which is hereby incorporated by reference herein in its entirety.

FIELD OF THE DISCLOSURE

The disclosure relates generally to plasma systems and more specifically to coatings for tooling and fixtures in plasma systems.

BACKGROUND OF THE DISCLOSURE

The present disclosure generally relates to coatings of parts that are used in plasma systems. Parts that are in direct contact with the plasma are subject to chemical attack, ion bombardment, UV irradiation, large temperature variations and gradients, as well as electrical fields. Preferred plasma system parts are made of aluminum or quartz, because they have the lowest plasma surface recombination rates for active oxygen, nitrogen and hydrogen species. However, when halogen-containing, or other chemically more aggressive plasmas are being employed, these materials are no longer an acceptable choice. In such environments, plasma system components are typically made from materials like anodized aluminum, alumina, or sapphire. While these materials have the advantage that they hold up better against chemical and physical plasma attack, the drawback is that they have substantially higher plasma surface recombination rates, hence removing a substantial portion of active oxygen, hydrogen and nitrogen plasma species from the plasma stream. The removal of these species reduces the efficiency of the plasma process.

Plasma system components configured to reduce the recombination rate of active plasma species and increasing the flow of active species to the system would be a welcomed improvement in plasma systems.

SUMMARY OF THE DISCLOSURE

Disclosed herein are surface coatings for plasma components that have the benefit of being robust against chemical and plasma physical attack in aggressive (e.g., fluorine-based) plasma environments. The coatings also provide low plasma surface recombination rates for active oxygen, nitrogen, fluorine, and hydrogen species when compared with other known surface treatments. The coatings can be applied to any plasma system component not requiring etching or plasma cleaning including but not limited to materials like quartz, aluminum, or anodized aluminum. Additionally, the efficiency of the system is increased by applying a non-reactive coating to system components thereby increasing the flow of excited plasma species to the processing chamber of the system.

Therefore, in one exemplary embodiment, the disclosure provides a coating for decreasing the reactivity of a plasma wetted surface system component. The coating comprising:
yttria having a composition of about:
yttrium in an amount of about 60% to about 80%;
oxygen in an amount of about 20% to about 40%;
and/or
aluminum oxynitride having a composition of about:
aluminum in an amount of between about 25% to about 60%;
oxygen in an amount of between about 20% to about 40%;
nitrogen in an amount of between about 20% to about 40%.
wherein the coating is applied to components of plasma-wetted system.

In some exemplary embodiments, the plasma comprises one or more of: atomic oxygen, molecular oxygen, atomic hydrogen, molecular hydrogen, atomic nitrogen, molecular nitrogen, molecular argon, atomic argon, atomic fluorine and molecular fluorine. In various of these and other embodiments the plasma comprises one or more of a fluorine-bearing plasma, an oxygen-bearing plasma, a hydrogen-bearing plasma and a nitrogen-bearing plasma. In various exemplary embodiments the plasma is a combination plasma. In particular embodiments the fluorine-bearing plasma comprises: $CF_4$, $CHF_3$, $CF_3H$, $C_2F_6$, $C_4F_8$, $SF_6$, $NF_3$, $F_2$ and $C_4F_8O$; the oxygen-bearing plasma comprises: $O_2$, $O_3$, $N_2O$, $CO$, $CO_2$, $C_4F_8O$, $H_2O$ and $H_2O_2$; the hydrogen-bearing plasma comprises: $H_2$, $CH_4$, $NH_3$, $N_2H_2$, $C_2H_2$, $H_2O$, $H_2O_2$, $N_2/H_2$, $He/H_2$ and $Ar/H_2$; and the nitrogen-bearing plasma comprises $N_2$, $N_2O$, $NH_3$, $NF_3$, $N_2/H_2$ and $NO$.

In these and other exemplary embodiments, the component is fabricated from quartz, aluminum, or anodized aluminum or combinations thereof.

In various exemplary embodiments, the coating is applied by, vapor deposition, sputter deposition, thermal spray coating, sol-gel coating, atmospheric plasma deposition, magnetron sputtering, electron beam deposition, or pulsed laser deposition. In some exemplary embodiments, the vapor deposition is plasma enhanced chemical vapor deposition (PECVD); physical vapor deposition (PVD); and chemical vapor deposition (CVD).

In various other exemplary embodiments, the plasma system is a downstream, remote plasma system, an inductively coupled plasma system, a capacitive coupled plasma system, a reactive ion etch plasma system, and atmospheric plasma system, and an ion-etch plasma system.

In one embodiment, a coating of a metal oxynitride, such as AlON (aluminum oxynitride), is applied directly to the plasma system components. We have found that the interaction of AlON with plasma streams produces a recombination rate that is substantially below that of anodized aluminum.

In various embodiments, the coating has a hardness of between about 3 GPa to about 10 GPa, an elastic (Young's) modulus of between about 100 GPa to about 20 GPa and the coating is stable at temperatures between about −150° C. and about +600° C.

In another exemplary embodiment, the disclosure teaches a method to increase the efficiency of plasma systems comprising applying a surface coating to system components not requiring plasma etching, the coating decreasing the reactivity of the non-etched components to a plasma stream wherein the surface coating is:
yttria having a composition of about:
yttrium in an amount of about 60% to about 80%;
oxygen in an amount of about 20% to about 40%;
and/or
aluminum oxynitride having a composition of about:
aluminum in an amount of between about 25% to about 60%;
oxygen in an amount of between about 20% to about 40%;
nitrogen in an amount of between about 20% to about 40%.

wherein the coating is applied to components of plasma-wetted system.

In another embodiment, a coating of a transition metal oxide, such as yttria, is applied directly to the plasma components. We have found that the interaction of yttria with plasma streams produces a recombination rate that is substantially below that of anodized aluminum.

In various exemplary embodiments, the plasma comprises one or more of: atomic oxygen, molecular oxygen, atomic hydrogen, molecular hydrogen, atomic nitrogen, molecular nitrogen, molecular argon, atomic argon, atomic fluorine and molecular fluorine. In various of these and other embodiments the plasma comprises one or more of a fluorine-bearing plasma, an oxygen-bearing plasma, a hydrogen-bearing plasma and a nitrogen-bearing plasma. In various exemplary embodiments the plasma is a combination plasma. In particular embodiments the fluorine-bearing plasma comprises: CF4, CHF3, CF3H, C2F6, C4F8, SF6, NF3, F2 and C4F8O; the oxygen-bearing plasma comprises: O2, O3, N2O, CO, CO2, C4F8O, H2O and H2O2; the hydrogen-bearing plasma comprises: H2, CH4, NH3, N2H2, C2H2, H2O, H2O2, N2/H2, He/H2 and Ar/H2; and the nitrogen-bearing plasma comprises N2, N2O, NH3, NF3, N2/H2 and NO.

In these and other exemplary embodiments, the component is fabricated from quartz, aluminum, or anodized aluminum or combinations thereof.

In various embodiments, the coating is applied by vapor deposition, sputter deposition, thermal spray coating, sol-gel coating, atmospheric plasma deposition, magnetron sputtering, electron beam deposition, or pulsed laser deposition. In some embodiments, the vapor deposition is plasma enhanced chemical vapor deposition (PECVD); physical vapor deposition (PVD); and chemical vapor deposition (CVD).

In various embodiments, the coating has a hardness of between about 3 GPa to about 10 GPa, an elastic (Young's) modulus of between about 100 GPa to about 20 GPa and the coating is stable at temperatures between about −150° C. and about +600° C.

In yet another exemplary embodiment, the disclosure teaches a method to increase the life-span of plasma systems components comprising applying a surface coating to system components the coating decreasing the reactivity of the components to a plasma stream wherein the surface coating is:
  yttria having a composition of about:
  yttrium in an amount of about 60% to about 80%;
  oxygen in an amount of about 20% to about 40%;
and/or
  aluminum oxynitride having a composition of about:
  aluminum in an amount of between about 25% to about 60%;
  oxygen in an amount of between about 20% to about 40%;
  nitrogen in an amount of between about 20% to about 40%.
wherein the coating is applied to components of plasma-wetted system.

In some exemplary embodiments, the plasma comprises one or more of: atomic oxygen, molecular oxygen, atomic hydrogen, molecular hydrogen, atomic nitrogen, molecular nitrogen, molecular argon, atomic argon, atomic fluorine and molecular fluorine. In various of these and other embodiments the plasma comprises one or more of a fluorine-bearing plasma, an oxygen-bearing plasma, a hydrogen-bearing plasma and a nitrogen-bearing plasma. In various exemplary embodiments the plasma is a combination plasma. In particular embodiments the fluorine-bearing plasma comprises: CF4, CHF3, CF3H, C2F6, C4F8, SF6, NF3, F2 and C4F8O; the oxygen-bearing plasma comprises: O2, O3, N2O, CO, CO2, C4F8O, H2O and H2O2; the hydrogen-bearing plasma comprises: H2, CH4, NH3, N2H2, C2H2, H2O, H2O2, N2/H2, He/H2 and Ar/H2; and the nitrogen-bearing plasma comprises N2, N2O, NH3, NF3, N2/H2 and NO.

In these and other exemplary embodiments, the component is fabricated from quartz, aluminum, or anodized aluminum or combinations thereof.

In some exemplary embodiments, the coating is applied by vapor deposition, sputter deposition, thermal spray coating, sol-gel coating, atmospheric plasma deposition, magnetron sputtering, electron beam deposition, or pulsed laser deposition. In various embodiments, the vapor deposition is plasma enhanced chemical vapor deposition (PECVD); physical vapor deposition (PVD); and chemical vapor deposition (CVD).

In various embodiments, the coating has a hardness of between about 3 GPa to about 10 GPa, an elastic (Young's) modulus of between about 100 GPa to about 20 GPa and the coating is stable at temperatures between about −150° C. and about +600° C.

Other coatings that can be applied are transition metal oxynitrides and metal oxides, which are crossed material categories of the metal oxynitrides and the transition metal oxides. Still other coatings that can be applied for protection of chamber components include rare earth compounds of the lanthanide or actenide subcategories, including rare earth oxides, rare earth nitrides, and rare earth oxynitrides.

Structurally, the coating can be applied by plasma enhanced chemical vapor deposition (PECVD), physical vapor deposition (PVD), sputter deposition, a thermal spray coating, a sol-gel coating, atmospheric plasma deposition, magnetron sputtering, electron beam deposition, or pulsed laser deposition. See, e.g., WO 2013/023029 to Gunda, published 14 Feb. 2013, describing, for example, the deposition of an aluminum oxynitride coating by a PVD process. The WO 2013/023029 application is owned by the applicant of the present application and is hereby incorporated by reference herein in its entirety, except for express definitions and the patent claims contained therein.

DETAILED DESCRIPTION

Figure 1:
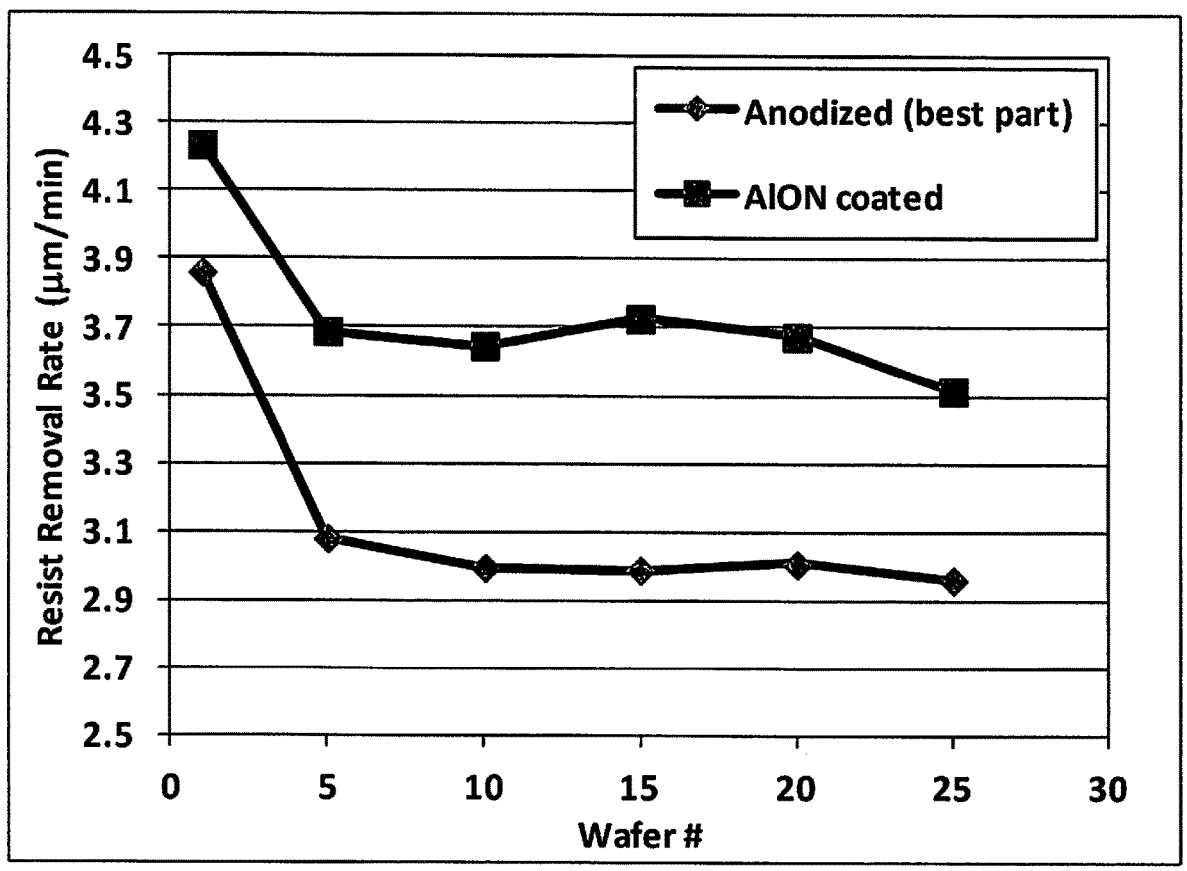
FIG. 1 graphically illustrates the photoresist removal rate for multiple wafers processed in a plasma cleaning tool using O2/FG plasma at 1 Torr, 2000 W. Compared are two plasma cleaning tool configurations: (i) using an optimized anodized aluminum baffle and (ii) using an aluminum oxynitride coated aluminum baffle.

Disclosed herein are surface coatings for plasma components that have the benefit of being robust against chemical and plasma physical attack in aggressive (e.g., fluorine-based) plasma environments. The coatings also provide low plasma surface recombination rates for active oxygen, nitrogen, fluorine, and hydrogen species when compared with other known surface treatments. The coatings can be applied to any plasma system component not requiring etching or plasma cleaning including but not limited to materials like quartz, aluminum, or anodized aluminum. Additionally, the efficiency of the system is increased by applying a non-reactive coating to system components thereby increasing the flow of excited plasma species to the plasma chamber of the system.

The terminology used herein is for the purpose of describing particular embodiments only and is not intended to be limiting. As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

References to "embodiment(s)", "embodiment(s) of the disclosure", and "disclosed embodiment(s)" contained herein refer to the specification (text, including the claims, and figures) of this patent application that are not admitted prior art.

As used herein, the term "plasma-wetted component" refers to any component or article that comes into contact with a plasma stream. Such component or article may be a part of a plasma chamber or it may be any article that is placed in a plasma chamber and is subjected to a plasma stream.

As used herein the term "plasma ashing" refers to the process of removing a photo resist from an etched wafer or other substrate.

As used herein the term "ashing chamber" refers to an enclosure holding a substrate, such as a wafer, which is subjected to plasma etching by a plasma stream.

As used herein, the term "ashed component" refers to a component of a plasma chamber which is desired to react with a plasma stream, such as the photoresist of a wafer.

As used herein, the term "non-ashed component" refers to a component of a plasma chamber which is not desired to react with a plasma stream. Such components include constitutive parts of the plasma chamber, such as valves, baffles, electrodes and the like as well as auxiliary materials placed in the chamber such as wafer supports or carriers.

As used herein the term "forming gas" refers to a mixture of hydrogen and an inert gas (usually nitrogen) that is used to reduce oxides on surfaces to water. They hydrogen is diluted in an inert gas to keep the hydrogen below about 4.7% by volume as this is the point above which hydrogen can spontaneously combust.

Various exemplary embodiments of devices and compounds as generally described above and methods according to this disclosure, will be understood more readily by reference to the following examples, which are provided by way of illustration and are not intended to be limiting of the invention in any fashion.

The following examples reference aluminum oxynitride (AlON) and yttria coatings, which are unique physical vapor deposition (PVD) coatings that are produced by Entegris, Inc., in Bedford Mass. In particular these coatings are 4-5 micrometer thick and have a chemical composition that is defined as shown in Table 1.

TABLE 1

| COAT-ING* | Al | Y | O2 | N | Hardness GPa | Elastic (Young's) Modulus GPa |
|---|---|---|---|---|---|---|
| AlON | 25-60% | NA | 20-40% | 20-40% | 3-10 | 100-200 |
| Yttria | NA | 60-80% | 20-40% |  | 3-10 | 100-200 |

*composition values listed are represented in atomic %, as determined by energy-dispersive x-ray analysis, also referred to as [EDAX].

Example 1

In this example, photoresist coated onto a 200 mm silicon substrate was exposed to plasma formed from oxygen and forming gas (3% hydrogen in nitrogen), using a Radiant Strip 220ES-IP plasma ashing tool, commercially available from Axcelis Technologies, Inc. A commercially available i-line photoresist was deposited onto the silicon substrate at a thickness of about 1.8 microns. The O2/FG plasma chemistry was formed by flowing 90% of oxygen and 10% of forming gas at about 3.5 standard liters per minute (slm) into the plasma ashing tool at a pressure of about 1 Torr, a temperature of about 270° C., and a power setting of 2000 Watts.

Photoresist removal rate (also referred to as Ashing rate) and cross wafer uniformity of the O2/FG plasma stripping process was determined after exposure of the photoresist to the respective plasma for 15 seconds. The Ashing rate was compared for two chamber baffle plate configurations:
  (i) an anodized aluminum baffle plate with an optimized surface finish thus providing highest ash rate obtainable with an anodized baffle plate configuration
  (ii) an aluminum baffle with an aluminum oxynitride coating that is commercially available from Entegris Specialty Coatings, in Bedford, Mass. 01730.

Other than the surface finish or surface coating composition, the two baffle configurations were identical in geometry, size and placement in the plasma cleaning system.

Ashing rate and non-uniformity was measured for six wafers in each configuration, the six wafers being placed in slots 1, 5, 10, 15, 20 and 25 of a 25-wafer test run. Ashing rate is computed by determining the difference in photoresist thickness (post-ash minus pre-ash) based on 49 measurement points on the wafer and removing the amount of photoresist shrinkage (a change in resist thickness as a result of temperature-only exposure). The photoresist shrinkage was found to be 4600 Å, as determined from a separate test run, wherein the wafers were processed with zero plasma power. The final change in thickness, sans the shrinkage, is expressed as a rate in μm/min, by taking into account the time of ash rate test.

Referring to FIG. 1, results from the EXAMPLE 1 ashing rate test are presented for embodiments of the disclosure. Note that the configuration utilizing AlON-coated aluminum baffle plates consistently produced ashing rates that are about 20% higher than those obtained with the optimized anodized baffle configuration. A higher ashing rate implies that more of at least one of active oxygen, hydrogen and nitrogen species are passed through the baffle plate to allow for reactions with the photoresist. A higher ashing rate is desired because it indicates a greater flow of reactive species to the chamber and therefore it allows for faster cleaning of the substrate.

Example 2

In this example, photoresist coated onto a 200 mm silicon substrate was exposed to various plasmas
  (i) an O2/FG plasma formed by flowing 90% of oxygen and 10% of forming gas into the plasma ashing tool at a pressure of about 1 Torr, a temperature of about 270° C., and a power setting of 2000 Watts;
  (ii) an O2/FG+CF4 plasma formed by flowing 90% of oxygen and 10% of forming gas, plus ~0.15% CF4 into the plasma ashing tool at a pressure of about 1 Torr, a temperature of about 270° C., and a power setting of 2000 Watts.
and in two different plasma cleaning systems:
  (i) a Radiant Strip 220ES-IP plasma ashing tool, commercially available from Axcelis Technologies, Inc.;
  (ii) a Radiant Strip 220 plasma ashing tool, commercially available from Axcelis Technologies, Inc.
  and for 4 different plasma tool baffle configurations:
  (i) an optimized anodized aluminum baffle;
  (ii) a standard anodized aluminum baffle;
  (iii) an aluminum oxynitride coated aluminum baffle;
  (iv) a yttria coated aluminum baffle.
  Other than the surface finish or surface coating, the four baffle configurations were identical in geometry, size and placement in the plasma cleaning system.

Ashing rate and non-uniformity was measured for 2 wafers in each configuration. The ashing rate was computed in the same manner as described for EXAMPLE 1.

Figure 2:
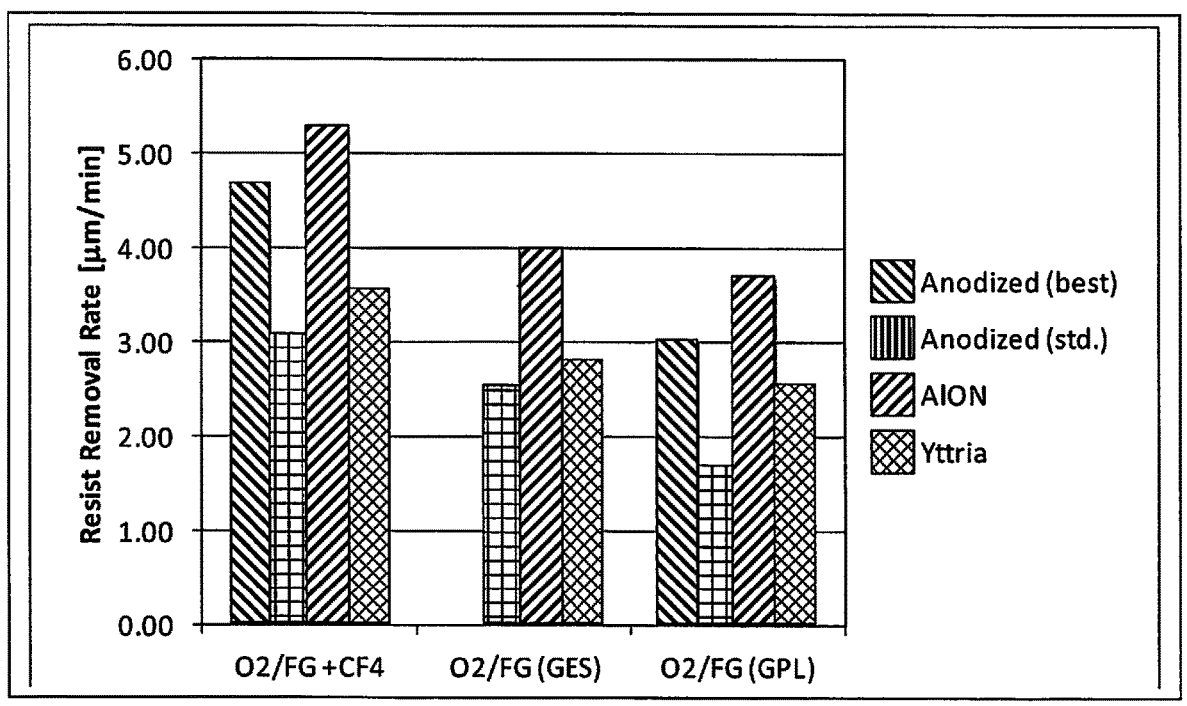
FIG. 2 illustrates a bar chart showing the photoresist removal rates for various plasma chemistries (O2/FG and O2/FG+CF4) and plasma systems (GES-IP, GPL) comparing four baffle plate configurations: (i) an optimized anodized aluminum baffle and (ii) a std. anodized aluminum baffle, (iii) an aluminum oxynitride coated aluminum baffle, (iv) a yttria coated aluminum baffle.

Referring to FIG. 2, results from the EXAMPLE 2 ashing rate test are presented for embodiments of the disclosure. The results indicate that the AlON-coated aluminum baffle plate configuration consistently exhibited highest ashing rates, with amounts that are greater than about 50% higher than ashing rates obtained with either a standard anodized aluminum baffle or a yttria-coated aluminum baffle and about 20% higher than ashing rates obtained with an optimized anodized aluminum baffle plate. A higher ashing rate implies that more of at least one of the active oxygen, hydrogen, fluorine and nitrogen species are passed through the baffle plate, due to reduced interaction with non-ashed components and thereby a greater flow of excited species to the ashed components. This allows for increased reactions with the photoresist. A higher ashing rate is desired because it allows for faster cleaning of the substrate.

The following paragraphs enumerated consecutively from 1 through 47 provide for various aspects of the present disclosure. In one embodiment, in a first paragraph (1), the present invention provides:
1. A coating for decreasing the reactivity of a plasma wetted surface system component comprising:
  yttria, having a composition of about:
    yttrium in an amount of about 60% to about 80%;
    oxygen in an amount of about 20% to about 40%;
  and/or
  aluminum oxynitride having a composition of about:
    aluminum in an amount of between about 25% to about 60%;
    oxygen in an amount of between about 20% to about 40%;
    nitrogen in an amount of between about 20% to about 40%;
  wherein the coating is applied to components of plasma-wetted system.
2. The coating of paragraph 1, wherein the coating is yttria comprising
    yttrium in an amount of about 60% to about 80%;
    oxygen in an amount of about 20% to about 40%.
3. The coating of paragraph 1, wherein the coating is aluminum oxynitride comprising:
    aluminum in an amount of between about 25% to about 60%;
    oxygen in an amount of between about 20% to about 40%;
    nitrogen in an amount of between about 20% to about 40%.
4. The coating of paragraphs 1-3, wherein the plasma comprises one or more of:
    atomic oxygen, molecular oxygen, atomic hydrogen, molecular hydrogen, atomic nitrogen, molecular nitrogen, molecular argon, atomic argon, atomic fluorine, molecular fluorine.
5. The coating of paragraphs 1-4, wherein the plasma comprises one or more of a fluorine-bearing plasma, an oxygen-bearing plasma, a hydrogen-bearing plasma and a nitrogen-bearing plasma.
6. The coating of paragraphs 1-5, wherein the fluorine-bearing plasma comprises: CF4, CHF3, CF3H, C2F6, C4F8, SF6, NF3, F2 and C4F8O.
7. The coating of paragraphs 1-5, wherein the oxygen-bearing plasma comprises: O2, O3, N2O, CO, CO2, C4F8O, H2O and H2O2.
8. The coating of paragraphs 1-5, wherein the hydrogen-bearing plasma comprises: H2, CH4, NH3, N2H2, C2H2, H2O, H2O2, N2/H2, He/H2 and Ar/H2.
9. The coating of paragraphs 1-5, wherein the nitrogen-bearing plasma comprises N2, N2O, NH3, NF3, N2/H2 and NO.
10. The coating of any of paragraphs 1-9, wherein the coating the coating is applied by, vapor deposition, sputter deposition, thermal spray coating, sol-gel coating, atmospheric plasma deposition, magnetron sputtering, electron beam deposition, or pulsed laser deposition.
11. The coating of paragraph 1-10, wherein the vapor deposition is plasma enhanced chemical vapor deposition (PECVD); physical vapor deposition (PVD); and chemical vapor deposition (CVD).
12. The surface coating of paragraphs 1-11, wherein the coating is stable at temperatures between about −150° C. and about +600° C.
13. The surface coating of paragraphs 1-12, wherein the plasma system is:
  a downstream, remote plasma system, an inductively coupled plasma system, a capacitive coupled plasma system, a reactive ion etch plasma system, and atmospheric plasma system, and an ion-etch plasma system.
14. The surface coating of paragraphs 1-13, wherein the coating has a hardness of between about 3 GPa to about 10 GPa.
15. The surface coating of paragraphs 1-14, wherein the coating has an elastic (Young's) modulus of between about 100 GPa to about 20 GPa.
16. The surface coating of any of paragraphs 1-15 wherein the component is fabricated from quartz, aluminum, or anodized aluminum or combinations thereof.
17. A method to increase the efficiency of plasma systems comprising applying a surface coating to system components not requiring plasma etching, the coating decreasing the reactivity of the non-etched components to a plasma stream wherein the surface coating is:
  yttria having a composition of about:
    yttrium in an amount of about 60% to about 80%;
    oxygen in an amount of about 20% to about 40%;
  and/or
    aluminum oxynitride having a composition of about:
    aluminum in an amount of between about 25% to about 60%;
    oxygen in an amount of between about 20% to about 40%;
    nitrogen in an amount of between about 20% to about 40%;
wherein the coating is applied to components of plasma-wetted system.

18. The method of paragraphs 17, wherein the plasma comprises one or more of:
atomic oxygen, molecular oxygen, atomic hydrogen, molecular hydrogen, atomic nitrogen, molecular nitrogen, molecular argon, atomic argon, atomic fluorine, molecular fluorine.

19. The method of paragraphs 17-18, wherein the plasma comprises one or more of a fluorine-bearing plasma, an oxygen-bearing plasma, a hydrogen-bearing plasma and a nitrogen-bearing plasma.

20. The method of paragraphs 17-19, wherein the fluorine-bearing plasma comprises: CF4, CHF3, CF3H, C2F6, C4F8, SF6, NF3, F2 and C4F8O.

21. The method of paragraphs 17-19, wherein the oxygen-bearing plasma comprises: O2, O3, N2O, CO, CO2, C4F8O, H2O and H2O2.

22. The method of paragraphs 17-19, wherein the hydrogen-bearing plasma comprises: H2, CH4, NH3, N2H2, C2H2, H2O, H2O2, N2/H2, He/H2 and Ar/H2.

23. The method of paragraphs 17-19, wherein the nitrogen-bearing plasma comprises N2, N2O, NH3, NF3, N2/H2 and NO.

24. The method of paragraphs 17-23, wherein the coating is applied by, vapor deposition, sputter deposition, thermal spray coating, sol-gel coating, atmospheric plasma deposition, magnetron sputtering, electron beam deposition, or pulsed laser deposition.

25. The method of paragraphs 17-24, wherein the vapor deposition is plasma enhanced chemical vapor deposition (PECVD); physical vapor deposition (PVD); and chemical vapor deposition (CVD).

26. The method of paragraphs 17-25, wherein the coating is stable at temperatures between about −150° C. and about +600° C.

27. The method of paragraphs 17-26, wherein the coating has a hardness of between about 3 GPa to about 10 GPa.

28. The method of paragraphs 17-27, wherein the coating has an elastic (Young's) modulus of between about 100 GPa to about 20 GPa.

29. The method of any of paragraphs 17-28, wherein the coating is yttria comprising
  yttrium in an amount of about 60% to about 80%;
  oxygen in an amount of about 20% to about 40%.

30. The method of any of paragraphs 17-29, wherein the coating is aluminum oxynitride comprising:
  aluminum in an amount of between about 25% to about 60%;
  oxygen in an amount of between about 20% to about 40%;
  nitrogen in an amount of between about 20% to about 40%.

31. The method of any of paragraphs 17-30, wherein the component is fabricated from quartz, aluminum, or anodized aluminum or combinations thereof.

32. A method to increase the life-span of plasma systems components comprising applying a surface coating to system components the coating decreasing the reactivity of the components to a plasma stream wherein the surface coating is:
  yttria having a composition of about:
    yttrium in an amount of about 60% to about 80%;
    oxygen in an amount of about 20% to about 40%;
  and/or
    aluminum oxynitride having a composition of about:
    aluminum in an amount of between about 25% to about 60%;
    oxygen in an amount of between about 20% to about 40%;
    nitrogen in an amount of between about 20% to about 40%;
wherein the coating is applied to components of plasma-wetted system.

33. The method of paragraph 32, wherein the plasma comprises one or more of:
atomic oxygen, molecular oxygen, atomic hydrogen, molecular hydrogen, atomic nitrogen, molecular nitrogen, molecular argon, atomic argon, atomic fluorine, molecular fluorine.

34. The method of paragraphs 32-33, wherein the plasma comprises one or more of a fluorine-bearing plasma, an oxygen-bearing plasma, a hydrogen-bearing plasma and a nitrogen-bearing plasma.

35. The method of paragraphs 32-34, wherein the fluorine-bearing plasma comprises: CF4, CHF3, CF3H, C2F6, C4F8, SF6, NF3, F2 and C4F8O.

36. The method of paragraphs 32-34, wherein the oxygen-bearing plasma comprises: O2, O3, N2O, CO, CO2, C4F8O, H2O and H2O2.

37. The method of paragraphs 32-34, wherein the hydrogen-bearing plasma comprises: H2, CH4, NH3, N2H2, C2H2, H2O, H2O2, N2/H2, He/H2 and Ar/H2.

38. The method of paragraphs 32-34, wherein the nitrogen-bearing plasma comprises N2, N2O, NH3, NF3, N2/H2 and NO.

39. The method of paragraphs 32-38, wherein the coating is applied by, vapor deposition, sputter deposition, thermal spray coating, sol-gel coating, atmospheric plasma deposition, magnetron sputtering, electron beam deposition, or pulsed laser deposition.

40. The method of paragraphs 32-39, wherein the vapor deposition is plasma enhanced chemical vapor deposition (PECVD); physical vapor deposition (PVD); and chemical vapor deposition (CVD).

41. The method of paragraphs 32-40, wherein the coating is stable at temperatures between about −150° C. and about +600° C.

42. The surface coating of paragraphs 32-41, wherein the coating has a hardness of between about 3 GPa to about 10 GPa.

43. The surface coating of paragraphs 32-42, wherein the coating has an elastic (Young's) modulus of between about 100 GPa to about 20 GPa.

44. The method of any of paragraphs 32-43, wherein the coating is yttria comprising
  yttrium in an amount of about 60% to about 80%;
  oxygen in an amount of about 20% to about 40%.

45. The method of any of paragraphs 32-44, wherein the coating is aluminum oxynitride comprising:
aluminum in an amount of between about 25% to about 60%;
oxygen in an amount of between about 20% to about 40%;
nitrogen in an amount of between about 20% to about 40%.

46. The method of any of paragraphs 32-45, wherein the component is fabricated from quartz, aluminum, or anodized aluminum or combinations thereof.

For purposes of interpreting the claims for the embodiments of the inventions, it is expressly intended that the provisions of 35 U.S.C. 112(f) are not to be invoked unless the specific terms "means for" or "step for" are recited in the respective claim.

While this invention has been described in conjunction with the various exemplary embodiments outlined above, various alternatives, modifications, variations, improvements and/or substantial equivalents, whether known or that are or may be presently unforeseen, may become apparent to those having at least ordinary skill in the art. Accordingly, the exemplary embodiments according to this invention, as set forth above, are intended to be illustrative not limiting. Various changes may be made without departing from the spirit and scope of the invention. Therefore, the invention is intended to embrace all known or later-developed alternatives, modifications, variations, improvements and/or substantial equivalents of these exemplary embodiments.

What is claimed is:

1. A coating applied to a surface of a component of a plasma-wetted system, wherein the coating comprises:
aluminum oxynitride having a composition of about:
aluminum in an amount of between about 25 at % to about 60 at %;
oxygen in an amount of between about 20 at % to about 40 at %; and
nitrogen in an amount of between about 20 at % to about 40 at %;
wherein the component of the plasma-wetted system consists essentially of aluminum, anodized aluminum or combinations thereof; and
wherein the coating is 4-5 µm thick, is substantially homogeneous, and is applied directly to the surface of the component and decreases the reactivity of the surface of the component of the plasma-wetted system.

2. The coating of claim 1, wherein the surface of the component of the plasma-wetted system is subjected to a plasma stream comprising one or more of:
atomic oxygen, molecular oxygen, atomic hydrogen, molecular hydrogen, atomic nitrogen, molecular nitrogen, molecular argon, atomic argon, atomic fluorine, molecular fluorine.

3. The coating of claim 2, wherein the plasma stream comprises one or more of a fluorine-bearing plasma, an oxygen-bearing plasma, a hydrogen-bearing plasma and a nitrogen-bearing plasma.

4. The coating of claim 3, wherein the fluorine-bearing plasma comprises: $CF_4$, $CHF_3$, $CF_3H$, $C_2F_6$, $C_4F_8$, $SF_6$, $NF_3$, $F_2$ and $C_4F_8O$.

5. The coating of claim 3, wherein the oxygen-bearing plasma comprises: $O_2$, $O_3$, $N_2O$, $CO$, $CO_2$, $C_4F_8O$, $H_2O$ and $H_2O_2$.

6. The coating of claim 3, wherein the hydrogen-bearing plasma comprises: $H_2$, $CH_4$, $NH_3$, $N_2H_2$, $C_2H_2$, $H_2O$, $H_2O_2$, $N_2/H_2$, $He/H_2$ and $Ar/H_2$.

7. The coating of claim 3, wherein the nitrogen-bearing plasma comprises $N_2$, $N_2O$, $NH_3$, $NF_3$, $N_2/H_2$ and $NO$.

8. The coating of claim 1, wherein the coating is applied by, vapor deposition, sputter deposition, thermal spray coating, sol-gel coating, atmospheric plasma deposition, magnetron sputtering, electron beam deposition, or pulsed laser deposition.

9. The coating of claim 8, wherein the vapor deposition is plasma enhanced chemical vapor deposition (PECVD); physical vapor deposition (PVD); and chemical vapor deposition (CVD).

10. The coating of claim 1, wherein the coating is stable at temperatures between about −150° C. and about +600° C.

11. The coating of claim 1, wherein the plasma-wetted system is:
a downstream, remote plasma system, an inductively coupled plasma system, a capacitive coupled plasma system, a reactive ion etch plasma system, and atmospheric plasma system, and an ion-etch plasma system.

12. The coating of claim 1, wherein the coating has a hardness of between about 3 GPa to about 10 GPa.

13. The coating of claim 1, wherein the coating has an elastic (Young's) modulus of between about 100 GPa to about 20 GPa.

14. The coating of claim 1, wherein a portion of the coating contacts the surface of the component and the portion has the composition of about:
aluminum in an amount of between about 25 at % to about 60 at %;
oxygen in an amount of between about 20 at % to about 40 at %; and
nitrogen in an amount of between about 20 at % to about 40 at %.

15. The coating of claim 1, wherein the coating is a single layer.

16. A plasma-wetted system comprising:
a component having a surface consisting essentially of aluminum, anodized aluminum or combinations thereof; and
a coating applied directly to the surface of the component so that a portion of the coating is in contact with the surface, which decreases the reactivity of the component of the plasma-wetted system, wherein the coating is 4-5 µm thick and substantially homogeneous, and wherein the portion of the coating comprises aluminum oxynitride having a composition of about:
aluminum in an amount of between about 25 at % to about 60 at %;
oxygen in an amount of between about 20 at % to about 40 at %; and
nitrogen in an amount of between about 20 at % to about 40 at %.

17. The coating of claim 16, wherein the coating is stable at temperatures between about −150° C. and about +600° C.

18. The coating of claim 16, wherein the plasma-wetted system is:
a downstream, remote plasma system, an inductively coupled plasma system, a capacitive coupled plasma system, a reactive ion etch plasma system, and atmospheric plasma system, and an ion-etch plasma system.

19. The coating of claim 16, wherein the coating has a hardness of between about 3 GPa to about 10 GPa.

20. The coating of claim 16, wherein the coating has an elastic (Young's) modulus of between about 100 GPa to about 20 GPa.

* * * * *